United States Patent
Taura

(10) Patent No.: US 6,636,441 B2
(45) Date of Patent: Oct. 21, 2003

(54) SEMICONDUCTOR MEMORY DEVICE INCLUDING NON-VOLATILE MEMORY CELL ARRAY HAVING MOS STRUCTURE IN WELL REGION FORMED ON SEMICONDUCTOR SUBSTRATE

(75) Inventor: Tadayuki Taura, Zushi (JP)

(73) Assignee: Kabushiki Kaisha Toshiba, Minato-Ku (JP)

( * ) Notice: Subject to any disclaimer, the term of this patent is extended or adjusted under 35 U.S.C. 154(b) by 7 days.

(21) Appl. No.: 09/987,611

(22) Filed: Nov. 15, 2001

(65) Prior Publication Data

US 2002/0057623 A1 May 16, 2002

(30) Foreign Application Priority Data

Nov. 15, 2000 (JP) ........................................ 2000-347540

(51) Int. Cl.[7] ............................................... G11C 16/04
(52) U.S. Cl. .............................. 365/185.28; 365/185.11; 365/185.18
(58) Field of Search ..................... 365/185.28, 185.18, 365/185.11, 185.01

(56) References Cited

U.S. PATENT DOCUMENTS 5,455,790 A * 10/1995 Hart et al. ............. 365/185.11
5,515,319 A * 5/1996 Smayling et al. ....... 365/185.27
5,982,668 A * 11/1999 Ishii et al. ............. 365/185.24
5,994,732 A * 11/1999 Ajika et al. ................. 257/315

FOREIGN PATENT DOCUMENTS

JP  9-307005  11/1997

* cited by examiner

Primary Examiner—Hoai Ho
(74) Attorney, Agent, or Firm—Banner & Witcoff, Ltd.

(57) ABSTRACT

There is provided a semiconductor memory device comprising a semiconductor substrate of a first conductive type, a first well region of a second conductive type formed on the semiconductor substrate, a second well region of a first conductive type formed in the first well region, a third well region of a first conductive type formed in the first well region, a memory cell array which is formed in each of the second well region and the third well region and which has a plurality of memory cells with a MOS structure, a first decoding circuit for selectively supplying a rewriting voltage signal to at least one of the second and third well regions and the source region of the memory cell at the time of rewriting data of the memory cell array, and a second decoding circuit for selectively supplying the rewriting voltage signal to the first well region.

13 Claims, 5 Drawing Sheets

SEMICONDUCTOR MEMORY DEVICE INCLUDING NON-VOLATILE MEMORY CELL ARRAY HAVING MOS STRUCTURE IN WELL REGION FORMED ON SEMICONDUCTOR SUBSTRATE

CROSS-REFERENCE TO RELATED APPLICATIONS

This application is based upon and claims the benefit of priority from the prior Japanese Patent Application No. 2000-347540, filed Nov. 15, 2000, the entire contents of which are incorporated herein by reference.

BACKGROUND OF THE INVENTION

1. Field of the Invention

The present invention relates to a semiconductor memory device having a memory cell array with a MOS structure formed in a well region formed on a semiconductor substrate, and, more particularly to a semiconductor memory device in which a memory cell array is divided into a plurality of blocks, and a memory content can be rewritten or erased with one block as a unit.

2. Description of the Related Art

Conventionally there is available a non-volatile semiconductor memory device having a structure disclosed in, for example, a Jpn. Pat. Appln. KOKAI Publication No. 9-307005. This memory device is configured by using a non-volatile memory transistor with a MOS structure which is used as an EEPROM memory cell for electrically erasing/writing data. There will be explained a structure of this prior art non-volatile semiconductor memory device by referring to FIG. 7.

An example shown in FIG. 7 has a structure in which two P-type well regions 102A and 102B are formed in an N-type well region 101 formed on a P-type semiconductor substrate 100. Non-volatile semiconductor memory cells 103A and 103B having a MOS structure are formed on the P-type well regions 102A and 102B, respectively.

For example, one memory cell 103A is a memory cell with an NMOS structure which has a gate structure in which there are provided a floating gate 107A and a control gate 108A formed of two layer polycrystalline silicon film via an insulation film 106A. The memory cell 103A has a gate insulation film 105A formed on a surface of the P-type well 102A. A source 104A and a drain 109A of the memory cell transistor 103A are formed as N-type diffusion layers on the surface region of the P-type well 102A. The diffusion layers 104A and 109A are formed to sandwich the gate insulation film 105A there-between.

An actual semiconductor memory device has a structure in which a plurality of memory cells are arranged in a matrix manner on the P-type well 102A, and any of the memory cells is selected by selectively driving a plurality of row lines (WLi) connected to the control gate 108A of each memory cell and a plurality of column or bit lines (BLi) connected to the drain 109A.

With respect to the other P-type well 102B, the NMOS memory cell 103B is formed in a similar manner.

Here, there will be explained an operation of the memory cell 103A having a structure shown in FIG. 7. In a data erasure mode for erasing data stored in the floating gate 107A, a high voltage of, for example, 10V is applied to the source 104A of the memory cell 103A, the N-type well 101 and the P-type well 102A. Further, a voltage of, for example, −7V is applied to the row line WLi, and −7V is applied to the control gate 108A of all memory cells formed on the P-type well 102A. Furthermore, the drain 109A is in the floating state.

At this time, electrons trapped in the floating gate 107A are discharged to a channel region formed between the source 104A and the drain 109A in the vicinity of the surface of the P-type well 102A with the FN tunneling of the gate insulation film 105A. At this time, a threshold of the memory cell 103A is lowered (the data state at this time is set to "1").

Next, data writing will be explained. In the data writing, for example, the memory cell 103A is selected for data writing so that any one of the plurality of row lines WLi is set to, for example, 9V while one or more of the plurality of bit lines BLi are set to, for example, 5V. The source 104A potential and the N-type well 101 potential are 0V. Assuming that the memory cell 103A is selected at this time, electrons are injected to the floating gate 107A with hot electron injection. At this time, the threshold of the memory cell 103A becomes high (the data state at this time is set to "0".)

Next, data reading will be explained. For example, any of the plurality of row lines WLi is set to, for example, about 5V in order select the memory cell 103A for reading. Furthermore, any of the bit lines BLi is set to a low voltage, for example, about 0.7V. Furthermore, the source potential and the N-type well 101 potential is 0V.

When the selected memory cell 103A is set to "0" namely, in a data written state at this time, the memory cell 103A is not turned on, therefore no current flows. Furthermore, when the selected memory cell 103A is set to "1", namely in the erasure state, the memory cell 103A is turned on, then a cell current, for example, current on the order of, for example, 40 $\mu$A is allowed to flow. The amplitude of this current is amplified by a sense amplifying circuit (not shown) or the like to be read.

In this manner, in the prior art structure of FIG. 7, the source potential SLi and the potential of the N-type well 101 are independently set. When even a slight time difference is present in the operation of setting these potentials, and the P-type well 102A to which the source line SLi potential is supplied has a positive potential with respect to the N-type well 101 to which an N-type well potential is supplied, a forward direction bias is applied to a PN junction between the P-type well 102A and the N-type well 101. As a consequence, there is a fear that a normal operation of a semiconductor memory device is hindered and the forward direction current flows in the PN junction so that too much power is consumed.

BRIEF SUMMARY OF THE INVENTION

According to one aspect of the present invention, there is configured a semiconductor memory device, comprising:

a semiconductor substrate of a first conductive type;

a first well region of a second conductive type formed on the semiconductor substrate;

a second well region of a first conductive type formed in the first well region;

a third well region of a first conductive type formed in the first well region;

a memory cell array which is formed on each of the second well region and the third well region and which has a plurality of memory cells with a MOS structure;

a first decoding circuit for selectively supplying a rewriting voltage signal to the second well region and a source region of the memory cell at the time of rewriting data of the memory cell array; and a second decoding circuit for selectively supplying the rewriting voltage signal to the first well region.

DETAILED DESCRIPTION OF THE INVENTION

Figure 1:
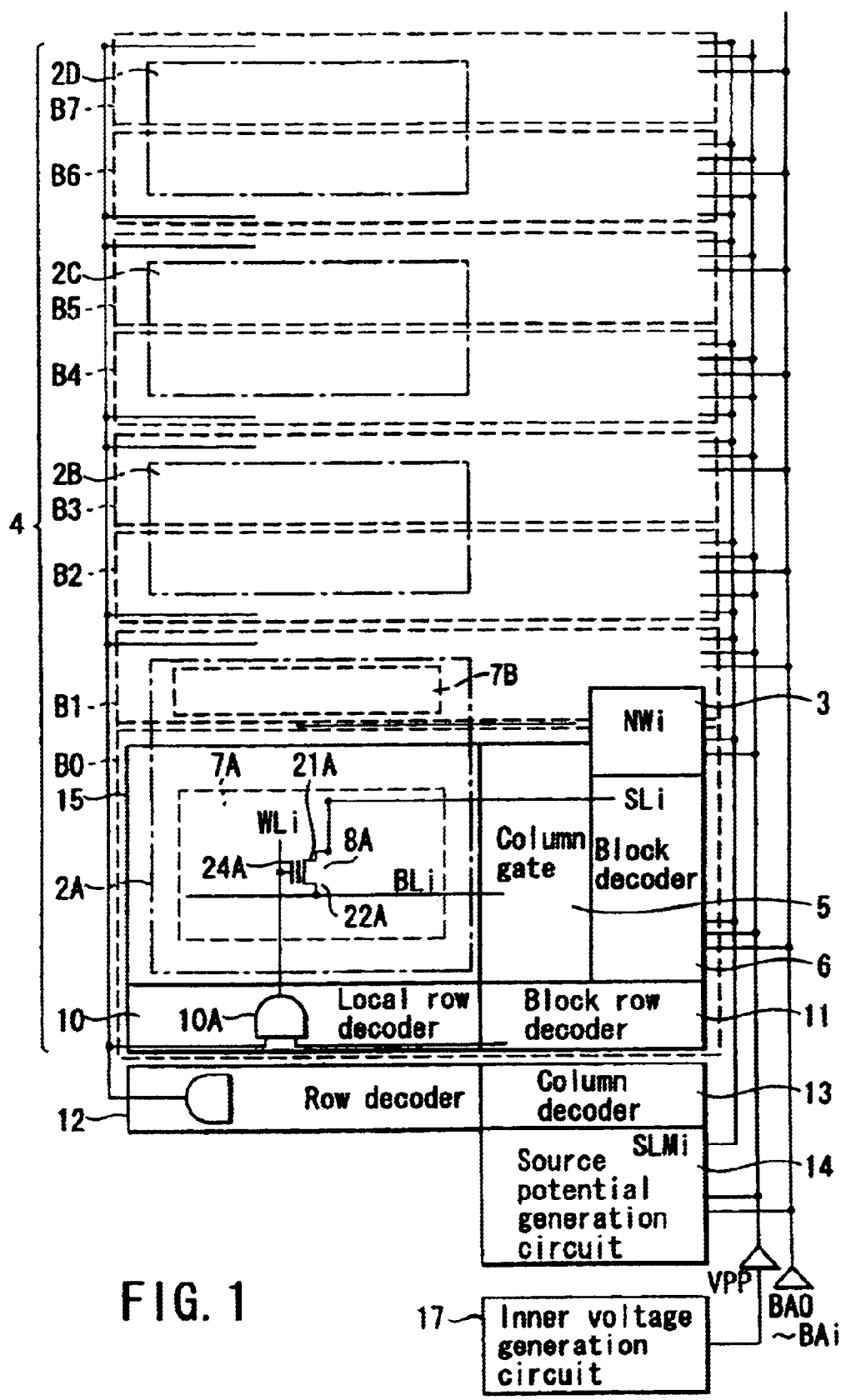
FIG. 1 is a block diagram showing a configuration of a first embodiment of the present invention.

Hereinafter, a plurality of embodiments of the present invention will be explained in detail by referring to the drawings. In the following description of the drawings, the like or similar portions are denoted with the like or similar reference numerals.

First Embodiment

FIG. 1 is a circuit diagram showing a configuration of major portions of a semiconductor memory device according to a first embodiment of the present invention. In the first embodiment, one memory cell array is divided into eight memory blocks B0 through B7, for example, to form data rewriting block group or a data erasure block group 4, for example. As will be explained later, since each of these blocks B0 through B7 constitutes a minimum unit for a package rewriting or erasure of data stored in the memory cell array, the blocks are referred to as an erasure block here, though these blocks may be operated as data rewriting blocks.

Of these erasure blocks B0 through B7, mutually adjacent erasure blocks B0 and B1, B2 and B3, B4 and B5, and B6 and B7 are commonly formed respectively on N-type wells 2A, 2B, 2C and 2D to form a combination pattern of blocks B0 to B7 and N-type wells 2A to 2D.

A plurality of erasure block groups, for example, tens of groups are juxtaposed at both sides of the erasure block group 4 configured of the erasure blocks B0 through B7 in FIG. 1.

A row decoder 12 which is a row selection circuit, a column decoder 13 which is a column selection circuit and a source potential generator 14 are connected commonly to the erasure block group 4. A high voltage VPP acting as an erasure voltage is supplied to the source voltage generation circuit 14 from an internal voltage generation circuit 17. On the basis of that, a source potential SLi is generated to be supplied to a source of a memory cell transistor and P-type well 7A in the erasure block group 4. Meanwhile, the VPP voltage may be supplied from an outside voltage generation circuit (not shown) instead of supplying the voltage VPP from the internal voltage generation circuit 17.

Here, for example, a column gate 5, a block decoder 6 and a memory cell array 15, each being formed of a plurality of MOS transistors, are formed in the erasure block B0. The column gate 5 formed of the MOS transistors constitutes a transfer gate. A MOS transistor having a source connected to a data line (not shown) receiving an output from a sense amplifier (not shown), and a gate to which a signal output from the column decoder 13 is supplied, is configured as an NMOS transistor. On the basis of block address signals BA0 to BAi to be input to the block decoder 6, a predetermined block in the blocks B0 to B7 is selected.

A P-type well 7A is formed in the N-type well 2A in the memory cell array 15. In this P-type well 7A, are formed a plurality of memory cell transistors 8A each having a control gate 24A connected to a word line WLi and a drain 22A connected to a bit line BLi.

An output signal from the block decoder 6 provided in the same erasure block B0 is input to a source 21A of this memory cell transistor 8A as a source potential SLi.

Furthermore, a local row decoder 10 is provided in the same erasure block B0 and a word line WLi signal is supplied to the control gate 24A of the memory cell transistor 8A. This local row decoder 10 is configured of an AND circuit 10A. An output signal of a block row decoder 11 provided in the same erasure block B0 and an output signal of the row decoder 12 provided on one end of the erasure block group 4 are input to the AND circuit 10A. The source voltage SLi is given to the N well decoder 3 and the block decoder 6 from the source voltage generation circuit 14.

An N-type well potential NWi is commonly supplied from the N-type well decoding circuit 3 in the N-type well 2A commonly provided in the erasure blocks B0 and B1.

The high voltage VPP generated in the internal voltage generation circuit 17 is supplied to the block decoder 6 and the N-type well decoder 3 in the erasure block group 4 as well as the source voltage generation circuit 14. Furthermore, the block selection address signals BA0 through BAi are input to the source voltage generation circuit 14 and the block decoder 6 in each of the erasure blocks B0 through B7 in the erasure block group 4.

Other erasure blocks B1 through B7 are formed in the same manner as the erasure block B0.

Next, an internal structure of a memory cell transistor formed in correspondence to the erasure blocks B0 and B1 in two P-type wells 7A and 7B formed in the N-type well 2A which is commonly provided for these two blocks B0 and B1 will be explained by referring to a sectional view shown in FIG. 2.

Figure 2:
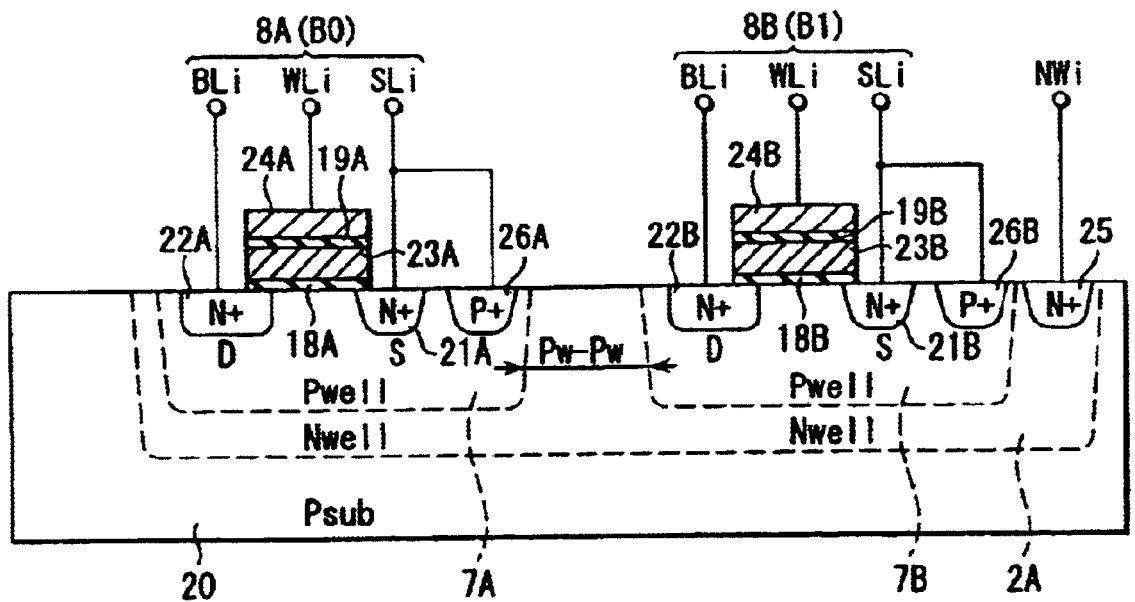
FIG. 2 is a sectional view showing a structure of two adjacent memory cell transistors formed in one N-type well region shown in FIG. 1.

In FIG. 2, the N-type well 2A is formed in a semiconductor substrate 20. In this N-type well 2A, P-type wells 7A and 7B are provided in a predetermined distance Pw—Pw in correspondence to the erasure blocks B0 and B1, respectively. Source diffusion layers 21A and 21B and drain diffusion layers 22A and 22B are formed in the respective P-type wells 7A and 7B. On an upper portion between the source and drain diffusion layers 21A and 22A and the source and drain diffusion layers 21B and 22B, floating gates 23A and 23B are formed via gate insulation films 18A and 18B, respectively. Furthermore, control gates 24A and 24B are formed via insulation films 19A and 19B to constitute memory cell transistors 8A and 8B. In the P-type wells 7A and 7B, P+ diffusion layers 26A and 26B are respectively formed for supplying the source potential SLi, so that the source potential SLi is supplied together with the source regions 21A and 21B, respectively. The N-type well potential NWi is supplied to the N-type well 2A via an N+ diffusion layer 25.

The distance Pw—Pw between the P-type wells 7A and 7B located adjacent to each other according to this embodiment is determined only with the processing allowance in the ion implantation process at the time of the formation of the P-type wells 7A and 7B.

That is, the distance Pw—Pw can be reduced to about 3.5 µm so that a higher integration of the semiconductor memory device is possible.

According to the embodiment, as shown in FIG. 1, in the N-type well 2A, the potential NWi is supplied from the N-type well decode circuit 3 to the N-type well 2A while the source line potential SLi is supplied from the block decoder 6 to the P-type wells 7A and 7B and the sources 21A and 21B of the memory cell transistors 8A and 8B. That is, the potentials NWi and SLi are given separately from potential sources different from each other.

Incidentally, the N-type well contact region 25 for supplying the potential NWi to this N-type well 2A can be provided in the peripheral region of the memory cell, and particularly the region 25 does not constitute a factor of increasing the area of the semiconductor memory device.

In particular, in the semiconductor memory device in which there are provided a large number of erasure blocks in the erasure block group 4, and the memory contents stored in the blocks can be erased in a finer manner, the effect of the area shrinkage is conspicuous in the case where the present invention is applied.

Here, for example, in the case where contents in the erasure block B0 is to be erased, 10V is applied to the source 21A of all the memory cells and to the P-type well 7A in the erasure block B0 as the source line potential SLi.

Furthermore, the N-type well potential NWi of 10V from the N-type well decoding circuit 3 is supplied to the common N-type well 2A of the erasure blocks B0 and B1. These blocks B0 and B1 are not erased at the same time.

A memory cell array of the erasure block B1 including the transistor 8B is also formed in the N-type well 2A which is supplied with the N-type well potential NWi of 10V. However, 0V is applied to the P-type well 7B which constitutes a substrate of the memory cell transistor 8B of the erasure block B1. As a consequence, the FN tunneling in the gate insulation film 18B is not generated, and data of the memory cell transistor 8B in the erasure block B1 is not erased.

Figure 3:
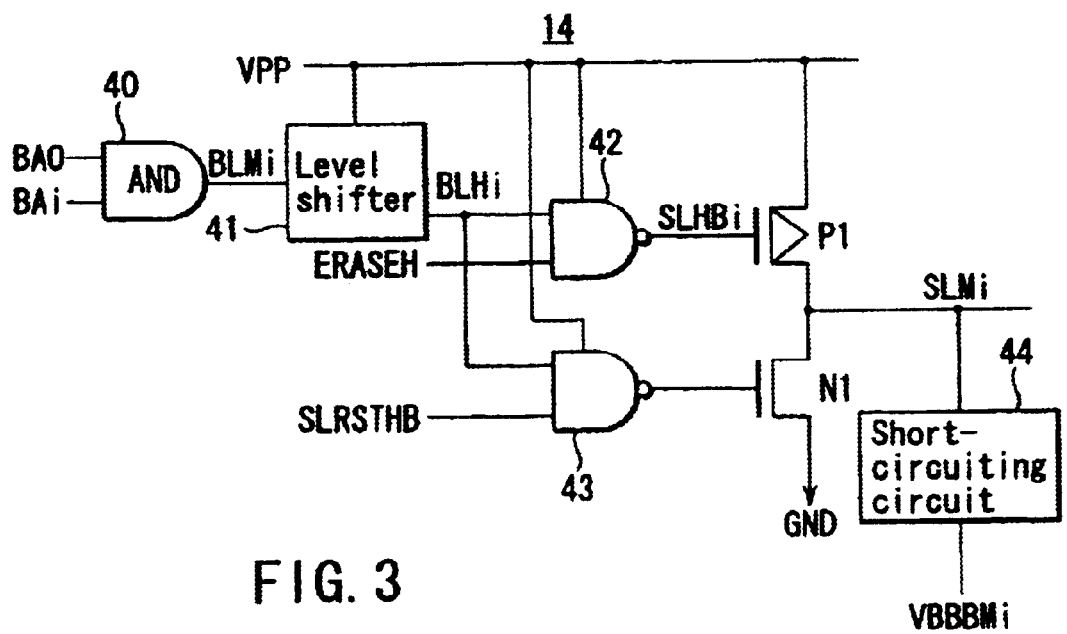
FIG. 3 is a circuit diagram of a source voltage generation circuit according to the first embodiment.

The circuit shown in FIG. 3 is a concrete example of the source voltage generation circuit 14 shown in FIG. 1. In FIG. 3, the block address signals BA0 to BAi are supplied to an AND circuit 40 to obtain an output BLMi. The output BLMi is supplied to a level shifter 41, and a level shift output BLHi is connected to one of input terminals of NAND circuits 42 and 43, respectively.

Output terminals of the NAND circuits 42 and 43 are respectively connected to gates of a P-type MOS transistor P1 and an N-type MOS transistor N1 which are connected in series across the VPP line and the ground line. A connection node of the MOS transistors P1 and N1 is connected to one end of a short-circuiting circuit 44. The high voltage VPP generated from the internal voltage generation circuit 17 is supplied to the level shifter 41, the NAND circuits 42 and 43 and the one end of the transistor P1, respectively.

In the source voltage generation circuit 14 thus configured, the AND circuit 40 is operated as a decoding circuit and receives a block selection input addresses BAj to BAi of the erasure block group to be erased included in the block address signals BA0 to BAi to set to "H" level, for example, a global selection signal BLMi which is generated in the semiconductor memory device and which is desired to be erased. Here, since the decoding circuit 40 is driven at an outside power source voltage, for example, VDD, the "H" level of the output BLMi is set to VDD level.

The level shifter 41 is a circuit for shifting the potential VDD of the global selection signal BLMi to, for example, a signal BLHi on a high potential VPP level generated in the inside of the semiconductor memory device. Here, for example, as the VPP level in the erasure case, the source line voltage SLi, for example, 10V is applied.

Furthermore, an ERASEH signal which is an erasure signal to be generated in the semiconductor memory device is also set to the VPP level. Since the input signals of the NAND circuit 42 are "H", the SLHBi signal which is a source line high voltage signal becomes 0V. Thus, the P-type transistor P1 is turned on, and VPP which is a source line potential at the time of erasure, for example, 10 V is applied to the source line SLMi from the source potential generation circuit 14.

At this time, a potential of a source line resetting high potential signal SLRSTB generated in the semiconductor memory device becomes the VPP level. Since both input signals of the NAND circuit 43 are at "H" level, an output of the NAND circuit 43 becomes Low, and the N-type transistor N1 is turned off.

Furthermore, at the time of the completion of the erasure operation, the ERASEH signal becomes 0V, and an output SLHBi of the NAND circuit 42 becomes VPP level, and the transistor P1 is turned off. After that, the erasure voltage VBBBMi of, for example, −7V supplied to the control gate of the memory cell and the source line voltage SLMi are short-circuited by the short-circuiting circuit 44. As a result, the potential of the control gate of the memory cell and that stored in the P-type well 7A are equalized so that the potential of the control gate of the memory cell 8A is brought to nearly zero. Then, the SLRSTHB signal to be supplied to the NAND circuit 43 becomes 0V. As a consequence, an output of the NAND circuit 43 becomes high while the transistor N1 is turned on.

The coupling of the transistor 8A is large so that the potential of the control gate of the transistor 8A will be largely increased up to −8V when the source line voltage SLMi is decreased very rapidly. The short-circuiting of the level SLMi and VBBBMi is aimed to prevent the transistor 8A from being destroyed caused by the rapid increase of the voltage of the control gate.

Here, when the N-type transistor N1 is turned on, electricity is discharged from the source line SLMi to the ground GND. In order to suppress a fluctuation of the power source (GND) level resulting from the abrupt discharge, the size of the N-type transistor N1 should be set to be relatively small, and the potential of the source line SLMi gradually falls.

In the present embodiment, the source voltage generation circuit 14 is commonly provided with respect to the erasure block groups. The number of the source voltage generation circuit 14 may be far smaller than the number of the erasure blocks.

Here, the short-circuiting circuit 44 having circuit elements of extremely large size is provided in the source voltage generation circuit 14. This is because of the necessity of short-circuiting the memory cell array in the erasure block having a large amount of parasitic capacity, as explained in FIG. 3, only one source voltage generation circuit 14 is commonly provided which largely contributes to the shrinkage of a device area.

Incidentally, a structure in which this source voltage generation circuit 14 is commonly used in the erasure block groups has a large advantage on the shrinkage of the device area with a combination with the common use of the well and the usage of the block decoding circuit in the embodiment. However, the former can be used solely which has an advantage of contributing to the shrinkage of the area of the semiconductor memory device.

Figure 4:
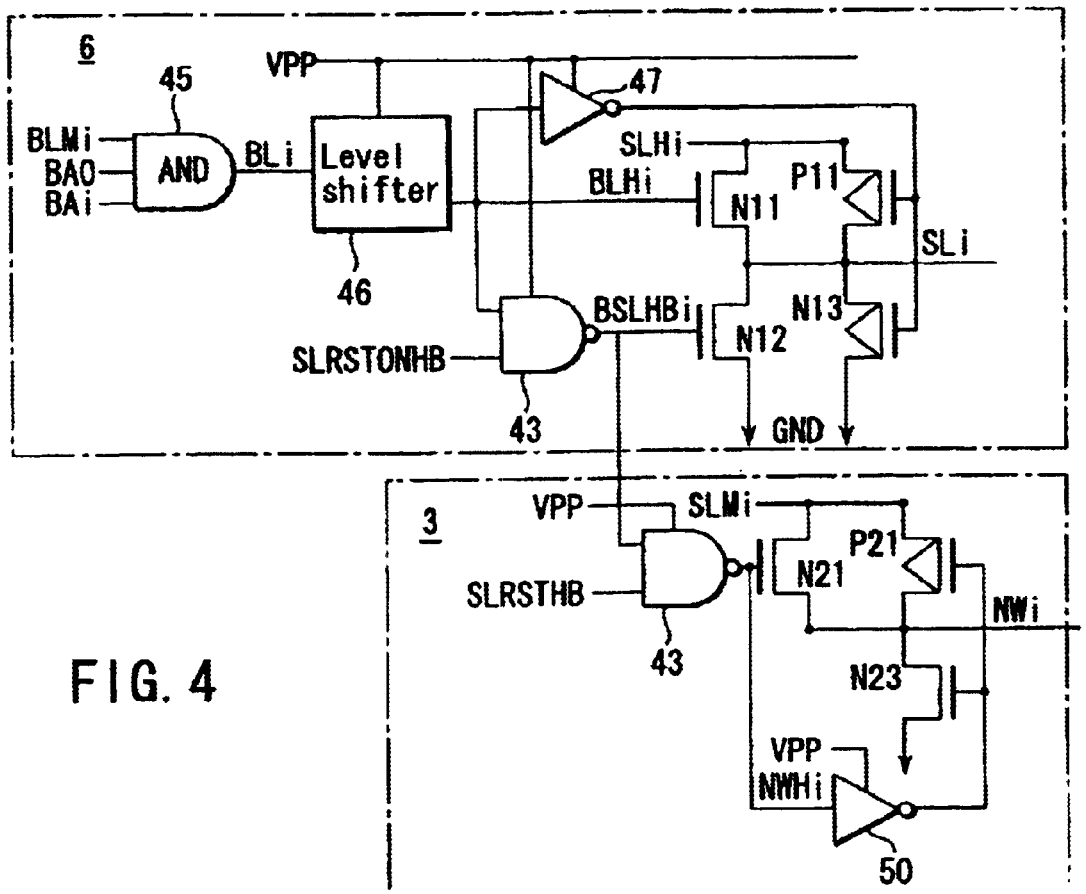
FIG. 4 is a circuit diagram showing a block decoder and an N-type well decoder according to the first embodiment.
Figure 7:
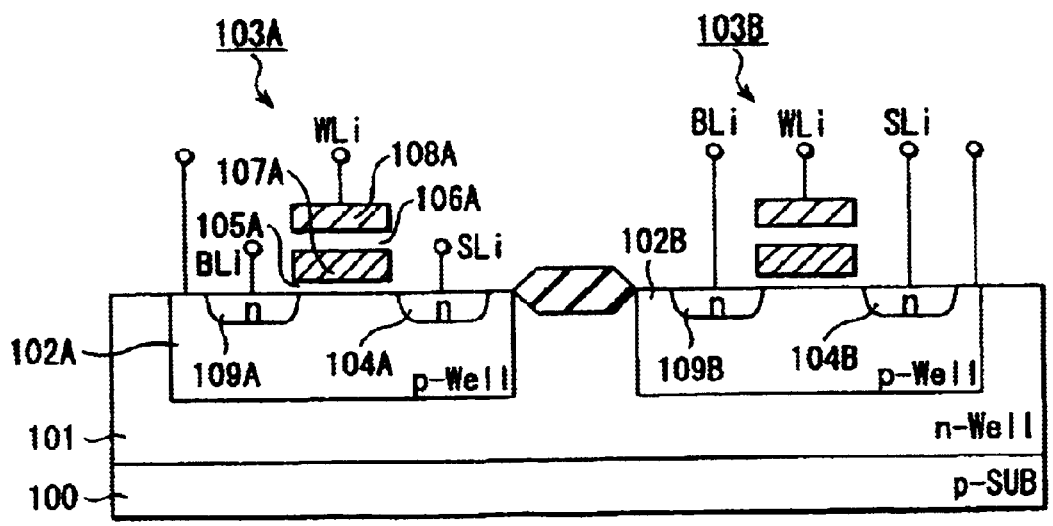
FIG. 7 is a sectional view showing a structure of a part of a conventional semiconductor memory device.

Next, there will be explained, by referring to FIG. 4, a circuit structure of the block decoder 6 and the N-type well decoder 3 shown in FIG. 1.

In the block decoder 6, an AND circuit 45 which is a decoding circuit receives the selection signal BLMi which is an output of the source voltage generation circuit 14 and the block addresses BA0 and BAi. When all these signals are set to a high level, a "H" level selection signal BLi is output. Here, since the AND circuit 45 is driven on the outside power source level VDD, the "H" level of the selection signal BLi is VDD. In order to shift the level of this signal to the internal voltage level VPP, the voltage is shifted by using a level shifter 46.

Furthermore, an output BLHi of the level shifter 46 is supplied via an inverter 47 or directly to a gate of a P-type transistor P11 and an N-type transistor N11 which constitute a transfer gate and which are connected in parallel with each other. When the output BLHi is "H", both the transistors P11 and N11 are turned on, so that the output SLMi of the source voltage generation circuit 14 is supplied to the source line SLi of the selected block.

Incidentally, an N-type transistor N13 is connected to this P-type transistor P11 in series across the SLMi line and the ground. Since a Low level is supplied to the gate of the transistor N13, the transistors N13 is turned off. The transistor N12 is connected in series to the transistor N11. To the gate of the transistor N12, an output of the NAND circuit 48 is supplied. The NAND circuit 48 is supplied with an output of the level shifter 46 and the source line reset on high potential signal SLRSONTHB.

Furthermore, the N-type transistor N12 has a relatively large size in order to allow a cell current at the time of writing and reading to flow therethrough. At this time, since the source line reset on high potential signal SLRSTONHB is of the VPP level, and a BSLHBi signal which is an output of the NAND circuit 48 becomes 0V, the transistor N12 is turned off.

Furthermore, the N-type well decoding circuit 3 has an NAND circuit 49 which receives the BSLHBi signal which is an output of the block decoder 6 and a BSLHBj signal which is an output of the block decoder in the erasure block B1 formed in the P-type well 7B located, for example, adjacent to the P-type well 7A and sharing the N-type well 2A.

When the signal BSLHBi is 0V, an output NWHi signal from this NAND circuit 49 becomes VPP level, so that this VPP signal is supplied to a gate of an N-type transistor N21 and a gate of a P-type transistor P21 via a second inverter 50. These transistors N21 and P21 constitute a transfer gate and apply the SLMi signal to the N-type well 2A as a potential NWi via this transfer gate.

Furthermore, after the completion of the erasure operation, and after the discharge operation of the SLMi potential is completed via the short-circuiting circuit 44 and the transistor N1 at the source voltage generation circuit 14, the SLRSTONHB signal becomes 0V with the result that the discharge transistor N12 of the source line is turned on. Furthermore, the transistors P21 and N21 of the transfer gate in the N-type well decoder 3 are turned off. An N-type transistor N23 connected in series with the P-type transistor P21 and having a gate connected to the gate of the transistor P21 is turned on to be connected to the GND, and the potential of the N-type well 2A is set to 0V.

Here, the source line voltage SLi and the N-type well voltage NWi are configured so as to be connected to the output SLMi of the source voltage generation circuit 14 via each transfer gate. Consequently, the voltages basically have the same potential with the result that a forward bias of a PN junction portion resulting from the bias relation of the N-type well 2A and the P-type wells 7A and 7B.

In this manner, even when the N-type well 2A of the memory cell array of the erasure blocks B0 and B1 adjacent to each other is shared with the two P-type wells 7A and 7B, an increase in the area can be suppressed while the generation of the forward bias resulting from the bias relation between the N-type well region and the P-type well region can be suppressed.

Second Embodiment

Figure 5:
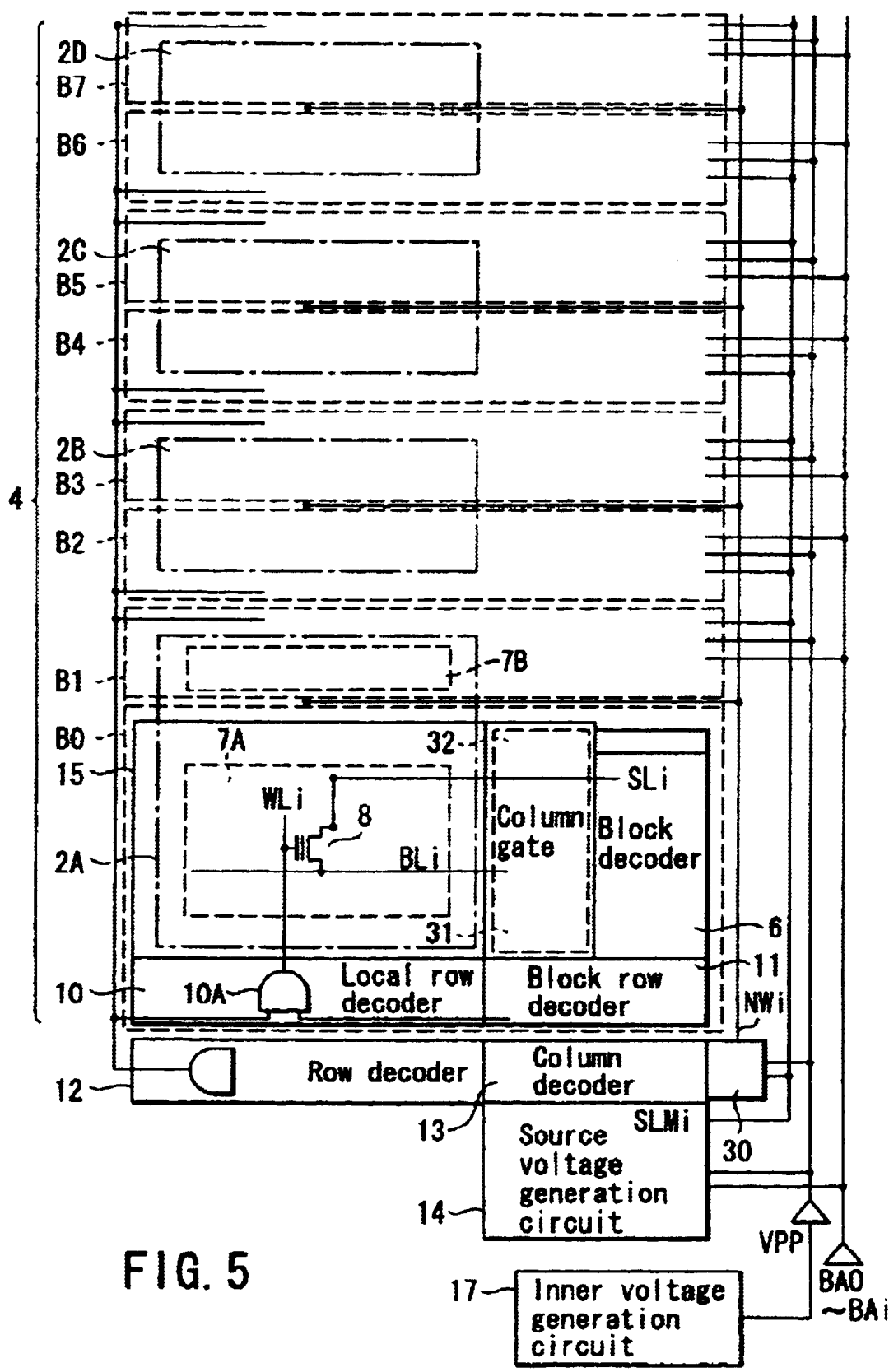
FIG. 5 is a block diagram showing a configuration of a second embodiment of the present invention.

There will be explained a semiconductor memory device according to a second embodiment of the present invention by referring to FIG. 5. In the device shown in FIG. 5, like portions as the device of FIG. 1 are denoted with the like reference numerals and an explanation thereof is omitted. In FIG. 5 as well, four N-type wells 2A to 2D are formed respectively commonly with respect to two adjacent erasure blocks B0 and B1, B2 and B3, B4 and B5, and B6 and B7 in erasure block group 4 having eight erasure blocks B0 through B7.

In the embodiment shown in FIG. 5, there is provided a structure in which these erasure blocks B0 to B7 are mutually electrically connected by commonly supplying an output of one N-type well decoding circuit 30 to the four N-type wells 2A to 2D provided with respect to a plurality (eight herein) of the erasure blocks B0–B7.

Furthermore, unlike the first embodiment of FIG. 1, not only adjacent memory cell arrays including the transistors 8A and 8B of, for example, the erasure blocks B0 and B1, but also one column gate 31 formed in the same N-type well is shared by two adjacent erasure blocks B0–B1. Here, the column gate 31 is formed in a P-type well 32 formed separately from the P-type well 7A formed in the N-type well 2A.

Since this column gate 31 provided in the P-type well 32 is provided in the N-type well 2A common with the memory cell array 15 unlike the case of FIG. 1 in which the P-type well is formed in the N-type well, and the column gate 31 provided on the P-type well is formed outside of the N-type well 2A, it is possible to reduce an influence of an increase in the area because of the presence of the boundary region between the N-type well 2A the P-type well on which the column gate 31 is provided outside of the N-type well 2A in the same erasure block B0.

Incidentally, the erasure block group sharing the N-type well decoder 30 is not necessarily set over the whole semiconductor memory device, and the N-type well decoder can be shared only with respect to a portion of the whole erasure block group.

In particular, when the N-type well decoder 30 is shared, an unfavorable influence is feared in the case where the load capacity of the decoder 30 is large. Thus, when the N-type well decoder is shared with respect to the erasure block group with a small-sized N-type well to be controlled, a fear of an increase in the load capacity can be prevented while an advantage of an area reduction is maintained. Incidentally, it is possible to apply this second embodiment to an erasure block group having a small well size such as a boot erasure block group other than the regular erasure block group.

Namely, the regular erasure group has a memory cell bit capacity of about 512K bits whereas the boot erasure block group has a memory cell capacity of about 64K bits which is about one eighth of the memory cell capacity of the regular erasure block group.

In the second embodiment, the number of the N-type well decoding circuits can be reduced to one eighth with respect to the first embodiment, therefore, there is an advantage of further reducing an area of the semiconductor memory device. Furthermore, since the area can be reduced with respect to the well boundary between the memory cell array and adjacent column gate 31, there is provided an advantage of reducing an area of the semiconductor memory device.

Furthermore, a structure of providing the column gate 31 forming well in the N-type well 2A is not necessarily required to be put into practice together with the sharing structure of the N-type well decoding circuit 30 to the adjacent two blocks like the second embodiment and the well arrangement structure can be put into practice in combination with the first embodiment. In this case as well, an advantage of reducing the area in such structure may also be realized.

Incidentally, in each of the first and second embodiments, the similar function as the source voltage generation circuit 14 may be provided in the block decoder 6 in each erasure block instead of providing one source voltage generation circuit 14 for each of the erasure block groups.

Third Embodiment

Here, there will be explained a third embodiment of the present invention by referring to FIG. 6.

Figure 6:
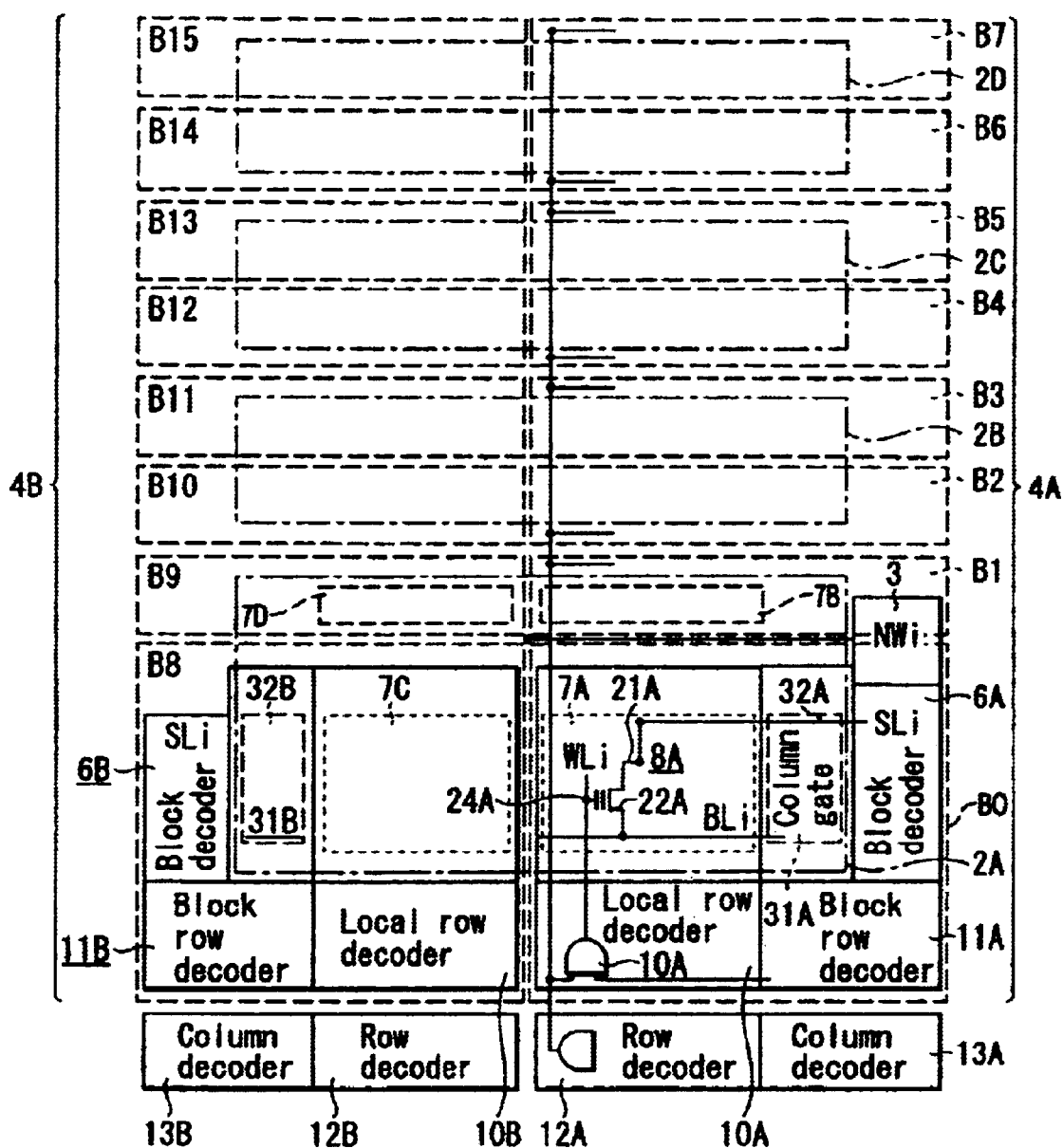
FIG. 6 is a block diagram showing a configuration of a third embodiment of the present invention.

In the device of FIG. 6, like portions as devices in FIGS. 1 and 5 are denoted with like reference numerals, and an explanation thereof is omitted. In FIG. 6, there are provided a first erasure block group 4A configured of eight erasure blocks B0 to B7 and a second erasure block group 4B configured of eight erasure blocks B8 to B15 having a linear symmetric pattern with respect thereto.

In one erasure block group 4A, four N-type wells 2A to 2D are respectively commonly formed with respect to the two adjacent erasure blocks B0 and B1, B2 and B3, B4 and B5, B6 and B7.

On the erasure block group 4A, a row decoder 12A which is a row selection circuit and a column decoder 13A which is a column selection circuit are arranged commonly.

Here, for example, in a P-type well 32A formed separately from the P-type well 7A in the N-type well 2A in the erasure block B0, a column gate 31A and a memory cell array are formed of the plurality of MOS transistors. A block decoder 6A is formed outside of the N-type well 2A in the erasure block B0. The column gate 31A is constituted with a transfer gate which is formed of MOS transistors. A data line (not shown) output from a sense amplifier is connected to the source of the transfer gate to be formed on the gate of the sense amplifier as an NMOS transistor (not shown) to which a signal output from the column decoder 13A is input. A predetermined block in the blocks B0 to B7 is selected on the basis of the block address signal input to the block decoder 6A.

The P-type well 7A is formed in the N-type well 2A in the memory cell array. In this P-type well 7A, the control gate 24A is connected to the word line WLi while a plurality of memory cell transistors 8A having the drain 22A connected to the bit line BLi are formed.

An output signal having a source potential SLi is generated from the block decoder 6A provided in the same erasure block B0 and is supplied to the source 21A of the memory cell transistor 8A.

Furthermore, a local row decoder 10A is provided in the same erasure block B0, so that a word line WLi signal is supplied to the control gate 24A of the memory cell transistor 8A. This local row decoder 10A is configured of the AND circuit 10A. An output signal of a block row decoder 11A provided in the same erasure group B0, and an output signal of a row decoder 12A provided in at one end of the same erasure block group 4A are input to this AND circuit 10A. From the source voltage generation circuit (not shown), a source voltage SLi is given to the N-type well decoder 3 and the block decoder 6A.

The N-type well potential NWi is commonly supplied from the N-type well decoding circuit 3 to the N-type well 2A commonly provided in the erasure blocks B0 and B1.

A high voltage VPP generated in an internal voltage generation circuit (not shown) is given to the block decoder 6A and the N-type well decoder 3 in the erasure block group 4A together with the source voltage generation circuit. Furthermore, a block selection address signal is input to the source voltage generation circuit and the block decoder 6A in each of the erasure blocks B0 to B7 in the erasure block group 4A.

The other erasure blocks B1 through B7 in the first erasure block group 4A are also configured in the same manner as the erasure block B0.

The erasure blocks B8 to B15 provided in the other erasure block group 4B are also configured in the same manner as the block group 4A. Consequently, with respect to all the corresponding portions, for example, a local row decoder corresponding to the local row decoder 10A is denoted by reference numeral 10B while a block row decoder corresponding to the block row decoder 11A is denoted by reference numeral 11B. However, for example, the N-type well 2A is different in that one N-type well 2A is provided commonly for a total of four erasure block groups, namely, two erasure blocks B0 and B1 on the side of the block group 4A, and two erasure blocks B8 and B9 on the side of the block group 4B. In a similar manner, the other N-type wells 2B, 2C and 2D are provided at a ratio of one for each of the four erasure blocks respectively. Furthermore, the N-type well decoder 3 is commonly provided on these four erasure blocks B0, B1, B8 and B9. Incidentally, all the P-type wells such as those 32A and 32B for forming column gates are formed in these N-type wells 2A through 2D and are fixed to 0V (GND).

In the embodiment of FIG. 6, there is also provided an advantage in that further size reduction and reduction in weight is made possible, and the design thereof is easy because the pattern of the block groups has a linear symmetric configuration.

Each of the above embodiments can be put into practice by respectively combining the embodiments.

As has been explained above, according to each of the embodiments, an increase in the area can be suppressed even when the N-type well region of the memory cell array of the erasure blocks adjacent to each other is shared while the generation of the forward bias of the PN junction resulting from a bias relation between the N-type well and the P-type well in two adjacent erasure blocks formed in the N-type well region can be suppressed and an increase in the power consumption can be suppressed.

Thus, an operation failure of the semiconductor memory device and an increase in the power consumption can be suppressed which result from the suppression of the forward bias.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate of a first conductive type;
a first well region of a second conductive type formed on the semiconductor substrate;
a second well region of a first conductive type formed in the first well region;
a third well region of a first conductive type formed in the first well region;
a memory cell array which is formed in each of the second well region and the third well region and which has a plurality of memory cells with a MOS structure;
a first decoding circuit for selectively supplying a rewriting voltage signal to at least one of the second and third well regions and a corresponding source region of the memory cell at the time of rewriting data of the memory cell array; and
a second decoding circuit configured to decode address signals supplied to the semiconductor memory device for selectively supplying the rewriting voltage signal to the first well region.

2. The semiconductor memory device according to claim 1, comprising a data rewriting circuit for generating a rewriting voltage signal of a voltage higher than a power source voltage at a time of rewriting data of the memory cell.

3. The semiconductor memory device according to claim 1, wherein the first decoding circuit comprises:
a third decoding circuit selected according to an address signal;
a voltage shifting circuit for shifting a voltage to a rewriting voltage higher than a power source voltage;
a gate control signal formation circuit for forming a pair of gate control signals having a polarity opposite to an output of the voltage shifting circuit;
a first transistor gate circuit which is configured of a first P-type transistor and a first N-type transistor wherein the rewriting voltage signal is supplied and the pair of gate control signals are supplied respectively to gates thereof; and
a second N-type transistor which is connected in series to the first N-type transistor and which is turned off at the time of data rewriting of the memory cell array.

4. The semiconductor memory device according to claim 1, wherein the memory cell array is divided into a plurality of data rewriting blocks,
the first decoding circuits are provided in plurality for each of the plurality of the data rewriting blocks;
the second decoding circuit has a third decoding circuit selected according to output signals from a plurality of first decoding circuits, a first transfer gate circuit configured of a first P-type transistor and a first N-type transistor, and a second N-type transistor which is turned off at the time of rewriting contents of the memory cell array.

5. The semiconductor memory device according to claim 3, wherein the first transfer gate circuit is turned on only at the time of data rewriting of a selected memory cell array.

6. The semiconductor memory device according to claim 4, wherein the first transfer gate circuit is turned on only at the time of data rewriting of a selected memory cell array.

7. The semiconductor memory device according to claim 1, wherein a potential of the first well region and a potential of the second well region have the same potential, being applied independently.

8. The semiconductor memory device according to claim 1, further comprising a selection circuit including a column selection circuit and a row selection circuit, wherein the column selection circuit is formed outside the first well region.

9. The semiconductor memory device according to claim 8, wherein the first to third well regions and the selection circuit are continuously arranged to constitute a data rewriting block group, and
which further comprises a first well decoder commonly applying a potential to the first well regions.

10. The semiconductor memory device according to claim 1, wherein the first well region and the second well region constitute a first data rewriting block, the first well region and the third well region constitute a second data rewriting block, and the first data rewriting block and the second data rewriting block are arranged adjacent to each other.

11. The semiconductor memory device according to claim 1, wherein a fourth well region and a fifth well region are formed at linear symmetric positions with respect to the second well region and the third well region in the first well region, the first well region and the fourth well region constitute a third data rewriting block, the first well region and the fifth well region constitute a fourth data rewriting block, and the third data rewriting block and the fourth data rewriting block are arranged adjacent to each other and configured at linear symmetric positions with respect to the first and second data rewriting blocks.

12. A semiconductor memory device comprising:
a semiconductor substrate of a first conductive type;
a first well region of a second conductive type formed on the semiconductor substrate;
a second well region of a first conductive type formed in the first well region;
a memory cell array in which memory cells with a MOS structure are arranged in a matrix manner in the second well region;
a first decoding circuit for selectively applying a rewriting voltage signal to the second well region and a source region of the memory cell at the time of rewriting data in the memory cell array;
a second decoding circuit configured to decode address signals supplied to the semiconductor memory device for selectively applying the rewriting voltage signal to the first well region;
wherein the first well region, the second well region, the first decoding circuit and the second decoding circuit constitute one rewriting block, a plurality of data rewriting blocks are continuously arranged to each other to constitute a rewriting block group, and the rewriting voltage signal is supplied to all the rewriting blocks in the same rewriting block group.

13. The semiconductor memory device according to claim 12, comprising a rewriting voltage signal generation circuit for generating a rewriting voltage signal at a time of rewriting data of the memory cell array.

* * * * *